United States Patent [19]

Hayashi

[11] Patent Number: 4,560,889

[45] Date of Patent: Dec. 24, 1985

[54] AUTOMATIC CLEAR CIRCUIT

[75] Inventor: Yasunori Hayashi, Ebina, Japan

[73] Assignee: Tokyo Shibaura Denki Kabushiki Kaisha, Kawasaki, Japan

[21] Appl. No.: 361,087

[22] Filed: Mar. 23, 1982

[30] Foreign Application Priority Data

Apr. 24, 1981 [JP] Japan .................... 56-62228

[51] Int. Cl.$^4$ ............... H03K 17/22; H03K 5/153
[52] U.S. Cl. ................... 307/290; 307/247 R; 307/597; 307/296 A; 307/350
[58] Field of Search ........... 307/290, 264, 265, 592, 307/247 R, 597, 350, 296 A, 268

[56] References Cited

U.S. PATENT DOCUMENTS

| | | | |
|---|---|---|---|
| 3,624,424 | 11/1971 | Ping et al. | 307/290 |
| 3,790,821 | 2/1974 | Adamson | 307/265 |
| 3,893,190 | 7/1975 | Robbins | 307/290 |
| 3,894,247 | 7/1975 | De Jong | 307/592 |
| 3,950,654 | 4/1976 | Broedner et al. | 307/592 |
| 4,173,756 | 11/1979 | Kawagai et al. | 340/636 |
| 4,229,666 | 10/1980 | Milburn, Jr. | 307/597 |
| 4,296,338 | 10/1981 | Thomas | 307/597 |
| 4,367,423 | 1/1983 | Hornung | 307/350 |
| 4,369,381 | 1/1983 | Okamoto et al. | 307/290 |
| 4,385,243 | 5/1983 | Suzuki | 307/350 |

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

In an autoclear circuit for producing reset signals for performing an initializing operation of a system simultaneously with the turning on of the system power supply, a first reset signal is produced by a delay circuit when a quickly rising power supply voltage is supplied through the input terminal connected to the power supply, and a second reset signal is produced by a Schmitt circuit when a slowly rising power supply voltage is supplied to the input terminal. Reset signals corresponding to the rise characteristics of the power supply voltage are thus produced and applied to the output terminal of the autoclear circuit to initialize the system.

1 Claim, 12 Drawing Figures

F I G. 9a
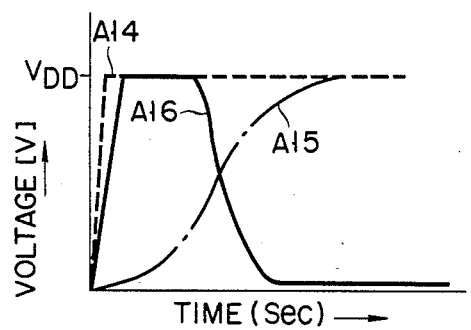
F I G. 9b
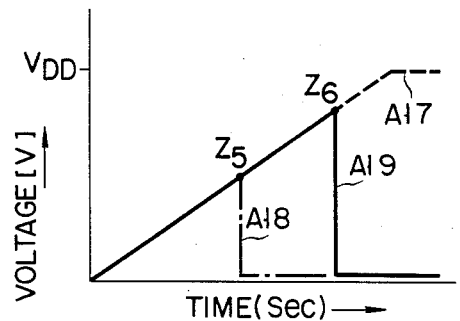
F I G. 10
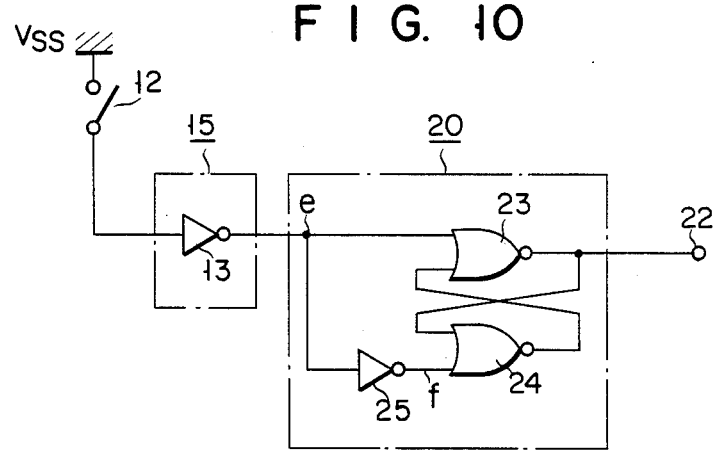

AUTOMATIC CLEAR CIRCUIT

BACKGROUND OF THE INVENTION

This invention relates to an autoclear circuit included in a large scale integration (abbreviated as LSI) circuit used with, for example, a timer, microcomputer or watch.

When power is supplied to a microcomputer, it is generally necessary for the operator to set the system at an initial stage by pushing a reset switch in order to clear the contents of a program counter or stack register. With a timer, too, it is required to define when a counter should be started in order to accurately detect an exact current point of time, and also to reset a counter once after power is supplied to the timer.

The autoclear circuit represents the type which automatically executes the initiation of the above-mentioned systems at the same time as the power supply.

FIGS. 1 and 3 denote the arrangements of the prior art autoclear circuits. FIGS. 2 and 4 represent the waveforms of signals used with the operation of the corresponding prior art autoclear circuits. The prior art autoclear circuit of FIG. 1 comprises a voltage-dividing circuit (consisting of resistors 1, 2) of power source voltage $V_{DD}$ and inverter 3. Namely where, with the autoclear circuit of FIG. 1, the switch 4 is closed, then the power source voltage $V_{DD}$ gradually rises, and is sent forth at such a level as is obtained by dividing the initial power source voltage $V_{DD}$ by the ratio of the value of the resistor 1 to that of the resistor 2 as measured from the voltage-dividing point a. Where the divided voltage level reaches the threshold voltage $Z_1$ of the inverter 3, then the inverter 3 is actuated, causing the voltage of the output terminal 5 thereof which has been kept at a high level up to this point to be inverted to a low level. Sent forth from the output terminal 5, therefore, is a pulse signal indicated in a solid line A3 in FIG. 2. Application of this pulse signal as a reset signal allows for the initiation of a system. In FIG. 2, a broken line A1 represents the rise of the power source voltage $V_{DD}$, and a one-dot dash line A2 denotes a voltage level occurring at the voltage-dividing point a.

The conventional autoclear circuit of FIG. 1, however, has the drawbacks that where a power source voltage $V_{DD}$ gently rises like that which results from the rectification of alternate current then said autoclear circuit of FIG. 1 is normally operated, but where D.C. voltage delivered from a mercury cell is applied as a power source, then said power source voltage $V_{DD}$ prominently rises, causing a voltage at the voltage dividing point a also to rise sharply; the inverter 3 is operated at an exceedingly high speed, causing an inverted pulse output to have an extremely narrow width; the following reset signal-receiving circuit fails to fully catch said pulse signal, preventing said autoclear circuit of FIG. 1 from being operated in a normal condition, and the power source voltage $V_{DD}$ is divided by the resistors 1 and 2, causing current to always flow between said source voltage $V_{DD}$ and earth voltage $V_{SS}$ and consequently resulting in large power consumption.

Description is now given of another prior art autoclear circuit of FIG. 3 in which D.C. voltage delivered from a mercury cell is used as a power source. This autoclear circuit comprises an integration circuit consisting of a resistor 6 and capacitor 7, and an inverter 8 supplied with on output from said integration circuit. Where, with the autoclear circuit of FIG. 3, a switch 9 is closed, then power source voltage $V_{DD}$ is impressed on said circuit, causing a signal having an integrated waveform indicated in a one-dot dash line A5 in FIG. 4 to be supplied from the integration circuit to an input point b of the inverter 8. Where a voltage signal having the integrated waveform reaches the threshold voltage $Z_2$ of the inverter 8, this inverter 8 is operated, causing a voltage at the output terminal 10 of the inverter 8 which has been kept at the source voltage $V_{DD}$ up to this point to be inverted to an earth level, and consequently a reset signal A6 (solid line) to be issued. A broken line A4 waveform shown in FIG. 4 represents the rise of the source voltage $V_{DD}$.

The prior art autoclear circuit of FIG. 3 also has the drawbacks that where the source voltage $V_{DD}$ gently rises like that of a power source resulting from the rectification of an alternate current unlike the autoclear circuit of FIG. 1, then said autoclear circuit of FIG. 3 is not actuated; namely where a time constant required for the rise of the source voltage $V_{DD}$ is about the same as an integration constant $\tau = CR$ defined by the resistor 6 and capacitor 7, then no sufficient delay takes place between the waveform A4 of a signal representing the power source $V_{DD}$ and the waveform A5 of a signal denoting a charge voltage at the output point b of the integration circuit, causing a reset signal to be issued with difficulty; where, with the autoclear circuit of FIG. 3, the capacitor 7 is fitted to the outside of a LSI circuit, then it is necessary to attach a connection terminal to said outside, making it necessary to use a larger chip; and even where the capacitor 7 is set in the LSI circuit, the pattern area of the capacitor 7 has to be increased in order to elevate its capacity, eventually making it necessary to apply a larger chip.

SUMMARY OF THE INVENTION

It is accordingly an object of this invention to provide an autoclear circuit which is applicable, no matter whether the power source voltage $V_{DD}$ quickly rises like that of a D.C. source derived from, for example, a mercury cell or slowly rises like that of a power source resulting from the rectification of an alternate current, and further easily allows for large scale integration.

According to this invention, there is provided an autoclear circuit for producing reset signals to initialize operation of a system comprising:

an input terminal supplied with a power supply voltage;

a delay circuit connected to the input terminal and which produces a first reset signal when a quickly rising power supply voltage is supplied to the input terminal;

a Schmitt circuit connected to the output of the delay circuit and which produces a second reset signal when a slowly rising power supply voltage is supplied to the input terminal; and an output terminal connected to the output of the Schmitt circuit to receive first or second reset signals depending on the rise characteristics of the power supply voltage and apply them to the system to initialize operation of the system;

whereby the initialization of the system can be positively effected irrespective of the rise characteristics of the power supply voltage.

BRIEF DESCRIPTION OF THE DRAWINGS

FIGS. 9a and 9b show the waveforms of signals appearing at several points on the autoclear circuit of FIG. 8; and FIG. 10 indicates the arrangement of an autoclear circuit according to a fourth embodiment of the invention.

DETAILED DESCRIPTION OF THE PREFERRED EMBODIMENTS

Figure 1:
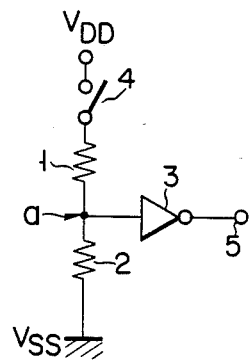
FIG. 1 shows the arrangement of a prior art autoclear circuit.
Figure 2:
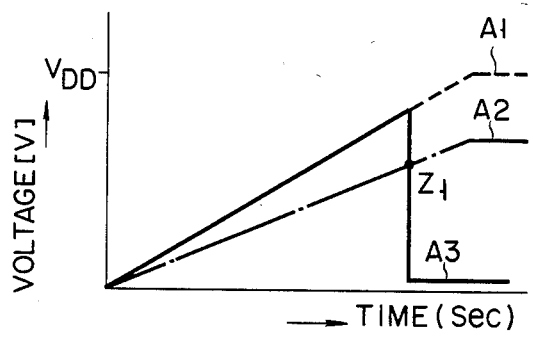
FIG. 2 indicates the waveforms of signals appearing at several points on the autoclear circuit of FIG. 1.
Figure 3:
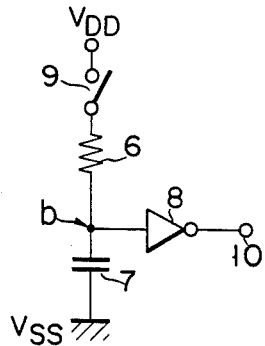
FIG. 3 shows the arrangement of another prior art autoclear circuit.
Figure 4:
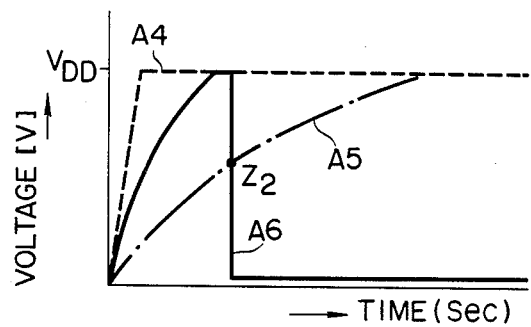
FIG. 4 sets forth the waveforms of signals appearing at several points on the autoclear circuit of FIG. 3.
Figure 5:
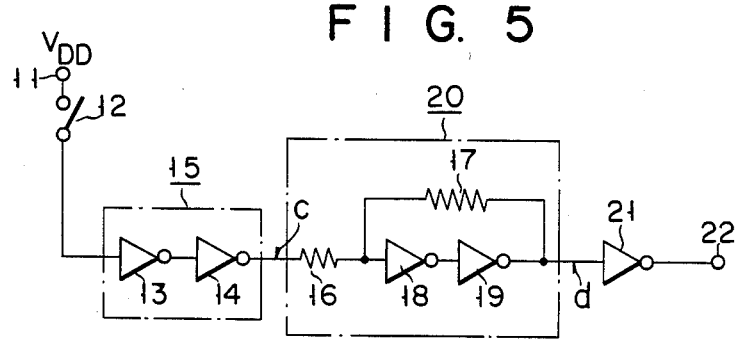
FIG. 5 indicates the arrangement of an autoclear circuit according to a first embodiment of this invention.

Description is first given with reference to FIG. 5 of an autoclear circuit according to a first embodiment of this invention. A power source terminal $V_{DD}$ 11 is connected to an output terminal 22 through a switch 12, a delay circuit 15 comprising two inverters 13, 14, Schmitt circuit 20 consisting of resistors 16, 17 and inverters 18, 19, and also through an inverter 21.

Figure 6A:
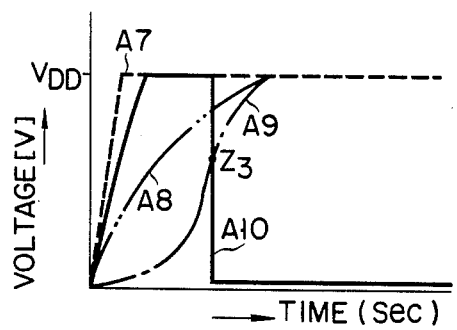
FIGS. 6a and 6b illustrate the waveforms of signals appearing at several points on the autoclear circuit of FIG. 5.

FIG. 6a shows the waveforms of operation signals when the autoclear circuit is impressed with a quickly rising source voltage $V_{DD}$. A broken line A7 shows the rise of a signal denoting the source voltage $V_{DD}$. A two-dot dash line A8 indicates the waveform of a voltage signal appearing at the output point c of a delay circuit 15. A one-dot dash line A9 illustrates the waveform of a voltage signal appearing at an output point d of the Schmitt circuit 20. A solid line A10 shows the waveform of a voltage signal appearing at the output terminal 22. Where, with the autoclear circuit of FIG. 5, the switch 12 is closed, then the voltage signal A8 at the output point c of the delay circuit 15 rises later than the source voltage A7 and is supplied to the Schmitt circuit 20, and then transmitted to the output point d in a state further delayed by said Schmitt circuit 20. Where the level of the voltage signal A9 at the output point d reaches the threshold voltage $Z_3$ of the inverter 21, then the voltage at the output terminal 22 which has been kept at the level of the power source voltage $V_{DD}$ is inverted to an earth level, causing a reset signal A10 to be issued.

Figure 6B:
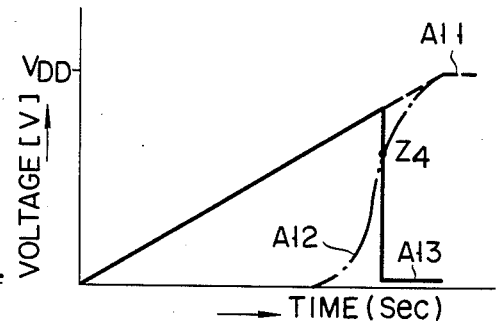

FIG. 6b shows the waveforms of signals appearing when the autoclear circuit is impressed with a slowly rising source voltage $V_{DD}$ like that which is obtained by rectifying an alternate current. Referring to FIG. 6b, the broken line A11 shows the rise of the power source voltage $V_{DD}$. A one-dot dash line A12 illustrates the waveform of a voltage signal appearing at the output point d of the Schmitt circuit 20. A solid line A13 represents the waveform of a voltage signal appearing at the output terminal 22. Where the switch 12 of the autoclear circuit of FIG. 5 is closed, then the voltage at the output point c of the delay circuit 15 rises to a high level. Since, however, the voltage at said output point c has a lower level than the threshold voltage $Z_4$, the voltage A12 at the output point d of the Schmitt circuit 20 is set at a low level. Later when the voltage A12 at the output poind d reaches the threshold voltage $Z_4$, then said voltage A12 is inverted to a high level. Since a sufficiently long time is consumed before said voltage A12 reaches the threshold voltage, a reset signal A13 having a broad time width is issued from the output terminal 22.

With an autoclear circuit according to the above-described embodiment, an effective reset signal is sent forth regardless of the speed at which the power source voltage $V_{DD}$ rises. All the elements constituting this autoclear circuit can be set in the LSI circuit. Further after a reset signal is issued in said autoclear circuit, no D.C. current passes between the power source voltage $V_{DD}$ and earth voltage level $V_{SS}$, thus consuming a small amount of power.

Figure 7:
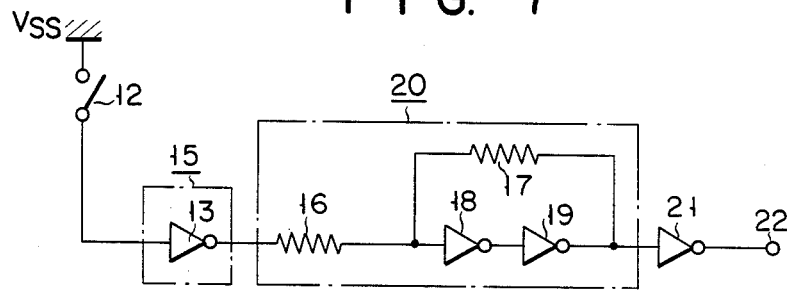
FIG. 7 shows the arrangement of an autoclear circuit according to a second embodiment of the invention.

Description is now given with reference to FIG. 7 of an autoclear circuit according to a second embodiment of this invention. The Schmitt circuit 20 of this second embodiment is of the resistor type as in the first embodiment. The delay circuit 15 of this Schmitt circuit 20 consists of a single inverter, and is supplied with the earth voltage $V_{SS}$. The autoclear circuit of the second embodiment is operated by the same principle as that of the first embodiment, description thereof being omitted.

Figure 8:
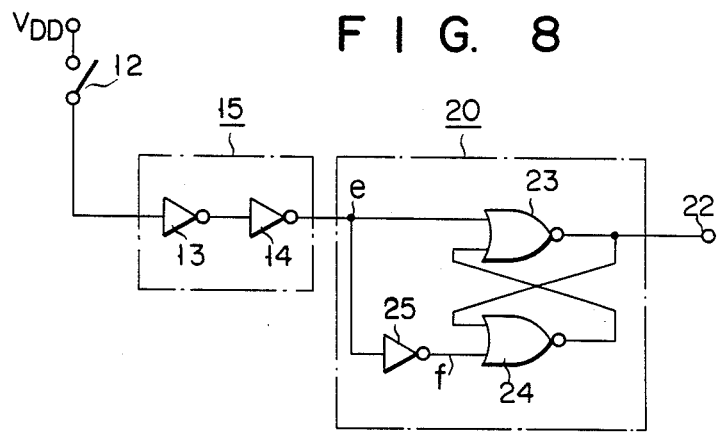
FIG. 8 gives the arrangement of an autoclear circuit according to a third embodiment of the invention.

Description is now given with reference to FIG. 8 of an autoclear circuit according to a third embodiment of this invention. The Schmitt circuit 20 of said autoclear circuit comprises an R-S flip-flop circuit consisting of NOR circuits 23, 24 and an inverter 25. The delay circuit 15 of said autoclear circuit is formed of two inverters 13, 14. With the autoclear circuit of FIG. 8, the threshold voltage impressed on one input point e of the NOR circuit 23 is chosen to have a high level, and the threshold voltage of the inverter 25 is set at a low level. Thus, the inverter 25 and NOR circuits 23, 24 jointly constitute the Schmitt circuit.

FIG. 9a illustrates the waveforms of signals appearing when the power source voltage $V_{DD}$ sharply rises. A broken line A14 represents the rise of a signal denoting the power source voltage $V_{DD}$. A one-dot dash line A15 denotes the waveform of a voltage signal at the output point e of the delay circuit 15. A solid line A16 shows the waveform of a voltage signal appearing at the output terminal 22 of the autoclear circuit of FIG. 8. Where the switch 12 is closed, then a voltage signal A15 appearing at the output point e of the delay circuit 15 rises later than the rise of a signal denoting the source voltage A14. Therefore, a signal appearing at the output terminal 22 is kept at a high level only while the voltage signal A15 appearing at the output point e of the delay circuit 15 remains at a low level, causing a reset signal A16 to be sent forth from the output terminal 22.

FIG. 9b shows the waveform of signals appearing when the source voltage signal $V_{DD}$ rises slowly. A broken line A17 represents the waveform of the rising source voltage $V_{DD}$. A one-dot dash line A18 shows the waveform of a voltage signal appearing at the output point f of an inverter 25. A solid line A19 indicates the waveform of a voltage signal appearing at the output terminal 22. Where the switch 12 is closed, then a slowly rising $V_{DD}$ signal A17 is transmitted to the output point e of the delay circuit 15. Where the voltage at said output point e reaches the threshold voltage $Z_5$ of the inverter 25, then the voltage A18 at the output point f of said inverter 25 is inverted to a low level. At this time a threshold voltage $Z_6$ at the input point e of the NOR circuit 23 is set at a higher level than the threshold voltage of the inverter 25. Therefore, the voltage at the input point e of the NOR circuit 23 is taken to have a low level, and an output voltage from the NOR circuit 23 is kept at a high level. Later when the voltage at the input point e of the NOR circuit 23 reaches the threshold voltage $Z_6$, then the voltage at the output point of the NOR circuit 23 which has been kept at a high level up to this point is inverted to a low level, causing a reset signal A19 to be issued from the output terminal 22.

Description is now given with reference to FIG. 10 of an autoclear circuit according to a fourth embodiment of this invention. This autoclear circuit comprises an R-S flip-flop circuit used as a Schmitt circuit 20 and an inverter 13 used as a delay circuit 15. An earth voltage $V_{SS}$ is supplied to the delay circuit 15. The autoclear circuit of FIG. 10 according to the fourth embodiment is operated by the same principle as the third embodiment of FIG. 8, description thereof being omitted. The second, third and fourth embodiments of FIGS. 7, 8 and 10 dispense with the application of an externally fitted element such as a capacitor, consume a smaller amount of power, and can be integrated on a large scale as easily as the first embodiment of FIG. 5. Further, like the first embodiment of FIG. 5, the second, third and fourth embodiments of FIGS. 7, 8 and 10 can issue an effective reset signal, regardless of whether a source voltage rises slowly or quickly.

What is claimed is:
1. An autoclear circuit for producing reset signals to initialize the operation of a system, comprising:
   a power supply to provide voltage to the system;
   an input terminal connected to the power supply;
   a delay circuit connected to said input terminal; a Schmitt circuit connected to the output of said delay circuit and producing a first reset signal when a quickly rising power supply voltage is supplied to said input terminal, and producing a second reset signal when a slowly rising power supply voltage is applied to said input terminal;
   an output terminal connected to the output of the Schmitt circuit to receive said first and second reset signals produced, depending on the rise characteristics of the power supply voltage, and apply them to the system to initialize the operation of the system, whereby the initialization of the system can be positively effected irrespective of the rise characteristics of the power supply voltage,
   said delay circuit being composed of at least one inverter, and
   said Schmitt circuit being composed of a first NOR circuit having a first input connected to the output of said delay circuit and an output connected to said output terminal; an inverter having an input connected to the output of said delay circuit; and a second NOR circuit having a first input connected to the output of said inverter, a second input connected to the output of said first NOR circuit, and an output connected to a second input of said first NOR circuit.

* * * * *